United States Patent
Huang et al.

(10) Patent No.: US 11,496,145 B2
(45) Date of Patent: Nov. 8, 2022

(54) PIPELINE ANALOG TO DIGITAL CONVERTER AND TIMING ADJUSTMENT METHOD

(71) Applicant: REALTEK SEMICONDUCTOR CORPORATION, Hsinchu (TW)

(72) Inventors: Shih-Hsiung Huang, Hsinchu (TW); Pan Zhang, Hsinchu (TW); Kai-Yin Liu, Hsinchu (TW); Chien-Ming Wu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/400,152

(22) Filed: Aug. 12, 2021

(65) Prior Publication Data

US 2022/0140836 A1 May 5, 2022

(30) Foreign Application Priority Data

Nov. 3, 2020 (TW) .................................. 109138205

(51) Int. Cl.
*H03M 1/06* (2006.01)
*H03M 1/66* (2006.01)
*H03M 1/10* (2006.01)
*H03M 1/16* (2006.01)
*H03M 1/38* (2006.01)

(52) U.S. Cl.
CPC ....... *H03M 1/0641* (2013.01); *H03M 1/1009* (2013.01); *H03M 1/168* (2013.01); *H03M 1/66* (2013.01); *H03M 1/0621* (2013.01); *H03M 1/38* (2013.01)

(58) Field of Classification Search
CPC .. H03M 1/0641; H03M 1/1009; H03M 1/168; H03M 1/66; H03M 1/38; H03M 1/0621
See application file for complete search history.

(56) References Cited

U.S. PATENT DOCUMENTS

2019/0296756 A1* 9/2019 Ali ....................... H03F 3/45242

FOREIGN PATENT DOCUMENTS

KR 1020120060280 * 6/2012 .......... H03M 1/0621

* cited by examiner

*Primary Examiner* — Joseph J Lauture
(74) *Attorney, Agent, or Firm* — WPAT, PC

(57) ABSTRACT

A pipeline analog to digital converter (ADC) includes converter circuitries, a detector circuitry, and a clock generator circuit. The converter circuitries sequentially convert an input signal to be digital codes. One of the converter circuitries includes a sub-ADC circuit and a multiplying digital to analog converter (MDAC) circuit. The sub-ADC circuit performs a quantization according to a first signal to generate a corresponding one of the digital codes, in which the first signal is the input signal or a previous stage residue signal. The MDAC circuit processes the corresponding one of the digital codes in response to a first clock signal, in order to generate a current stage residue signal. The detector circuitry detects whether the quantization is complete, in order to generate a control signal. The clock generator circuit adjusts a timing of the first clock signal according to the control signal.

18 Claims, 7 Drawing Sheets

PIPELINE ANALOG TO DIGITAL CONVERTER AND TIMING ADJUSTMENT METHOD

BACKGROUND

1. Technical Field

The present disclosure relates to a pipeline analog to digital converter (ADC). More particularly, the present disclosure relates to a pipeline ADC having an adjustable amplification phase and a timing adjustment method thereof.

2. Description of Related Art

A pipeline analog to digital converter may utilize multiple conversions to sequentially convert an input signal to be a corresponding digital code. In current approaches, an operating interval for each conversion is fixed. With the increase of the frequency of the clock signal, a time interval of one period becomes smaller. In order to make the pipeline ADC correctly process the conversion result in a short interval, certain circuits (e.g., a residue amplifier) are required to have higher current. As a result, overall power consumption and overall circuit area are increased.

SUMMARY

In some aspects, a pipeline analog to digital converter includes converter circuitries, a detector circuitry, and a clock generator circuit. The converter circuitries are configured to sequentially convert an input signal to be a plurality of digital codes, in which one of the plurality of converter circuitries includes a sub-analog to digital converter circuit and a multiplying digital to analog converter circuit. The sub-analog to digital converter circuit is configured to perform a quantization according to a first signal to generate a corresponding one of the plurality of digital codes, in which the first signal is the input signal or a previous stage residue signal. The multiplying digital to analog converter circuit is configured to process the corresponding one of the plurality of digital codes in response to a first clock signal, in order to generate a current stage residue signal. The detector circuitry is configured to detect whether the quantization is complete, in order to generate a control signal. The clock generator circuit is configured to adjust a timing of the first clock signal according to the control signal.

In some aspects, a timing adjustment method includes the following operations: providing a first clock signal to one of a plurality of converter circuitries in a pipeline analog to digital converter, wherein the one of the plurality of converter circuitries is configured to perform a quantization according to a first signal to generate a digital code, and process the digital code and the first signal to generate a current stage residue signal; detecting whether the quantization is complete, in order to generate a control signal; and adjusting a timing of the first clock signal according to the control signal.

These and other objectives of the present disclosure will be described in preferred embodiments with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
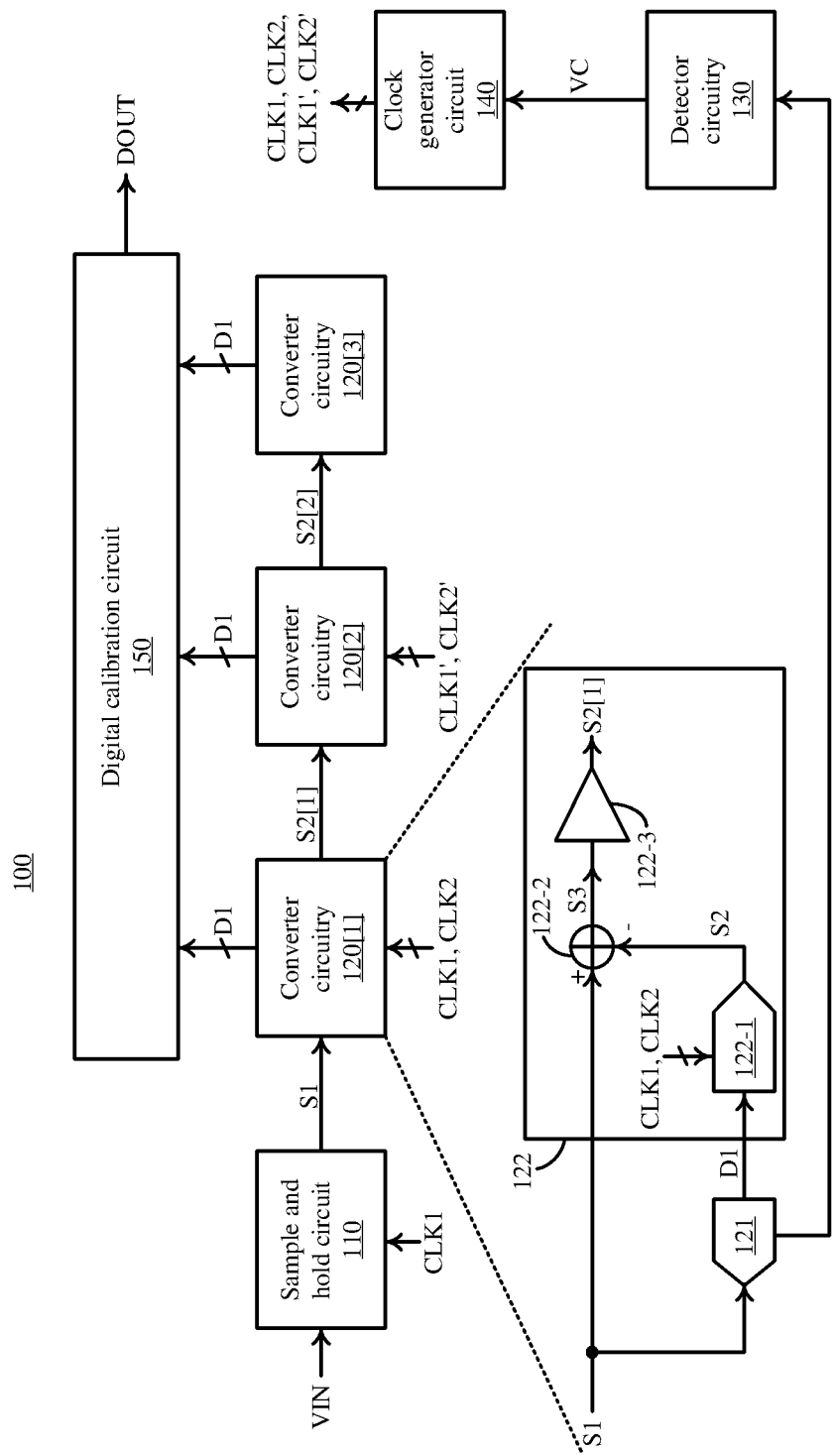
FIG. 1A is a schematic diagram of a pipeline analog to digital converter (ADC) according to some embodiments of the present disclosure.
Figure 1B:
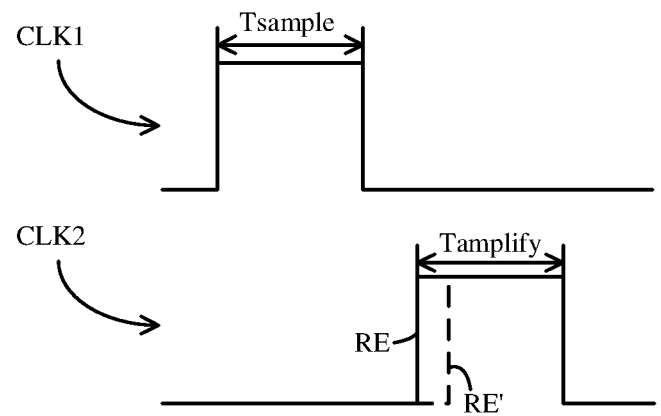
FIG. 1B is a schematic diagram showing waveforms of two clock signals in FIG. 1A according to some embodiments of the present disclosure.

FIG. 1A is a schematic diagram of a pipeline analog to digital converter (ADC) 100 according to some embodiments of the present disclosure, and FIG. 1B is a schematic diagram showing waveforms of a clock signal CLK1 and a clock signal CLK2 in FIG. 1A according to some embodiments of the present disclosure. The pipeline ADC 100 includes a sample and hold circuit 110, converter circuitries 120[1]-120[3], a detector circuitry 130, a clock generator circuit 140, and a digital calibration circuit 150.

The sample and hold circuit 110 samples an input signal VIN the clock signal CLK1, and outputs the sampled input signal VIN to be a signal S1. In some embodiments, the sample and hold circuit 110 may be implemented with a switched capacitor circuit. The converter circuitries 120[1]-120[3] sequentially convert the sampled input signal (i.e., the signal S1) to be digital codes D1. In some embodiments, the converter circuitries 120[1]-120[2] have the same circuit architecture. In some embodiments, the converter circuitry 120[3] may be (but not limited to) a flash ADC circuit, which is configured to generate a last one of the digital codes D1 according to a residue signal S2[2] generated from the converter circuitry 120[2].

Taking the converter circuitry 120[1] as an example, the converter circuitry 120[1] includes a sub-analog to digital converter (sub-ADC) circuit 121 and a multiplying digital to analog converter (MDAC) circuit 122. During a sampling phase Tsample of the clock signal CLK1, the sub-ADC circuit 121 is configured to perform a quantization according to the signal S1, in order to generate a corresponding one of the digital codes D1. The MDAC circuit 122 is configured to process the corresponding one of the digital codes D1 and the signal S1 according to the clock signal CLK2, in order to generate a current stage residue signal S2[1]. For example, in response to a rising edge RE of the clock signal CLK2, the MDAC circuit 122 may start processing the corresponding digital code D1 the signal S1, and generate the current residue signal S2[1] during an am plication phase Tamplify of the clock signal CLK2. Operations of the converter circuitry 120[2] are performed according to a clock signal CLK1' and a clock signal CLK2', and can be understood with reference to those of the converter circuitry 120[1], and thus the repetitious descriptions are not further given.

In some embodiments, the MDAC circuit 122 includes a sub-digital to analog converter circuit (sub-DAC) circuit 122-1, a subtractor circuit 122-2, and a residue amplifier circuit 122-3. In response to the clock signal CLK2, the sub-DAC circuit 122-1 may convert the corresponding digital code D1 to be a signal S2. The subtractor circuit 122-2 may subtract the signal S2 from the signal S1, in order to generate a signal S3. The residue amplifier circuit 122-3 may amplify the signal S3 to output a current stage residue signal S2[1]. In some embodiments, the sub-DAC circuit 122-1, the subtractor circuit 122-2, and the residue amplifier circuit may be implemented with a switched-capacitor circuit (not shown). Some switches in the switched-capacitor circuit are turned on during the sampling phase Tsample of the clock signal CLK1, in order to store the signal S1. Other switches in the switched-capacitor circuit are turned on during the amplification phase Tamplify of the clock signal CLK2, in order to generate the operations of the MDAC circuit 122.

The detector circuitry 130 is configured to detect whether the quantization of the signal S1 is complete, in order to generate a control signal VC. The clock generator circuit 140 may be configured to generate the clock signal CLK1, the clock signal CLK2, the clock signal CLK1', and the clock signal CLK2'. The clock generator circuit 140 may adjust the timing of the clock signal CLK2 (and/or the clock signal CLK2') according to the control signal VC. For example, if the detector circuitry 130 detects that the quantization of the signal S1 is complete, the detector circuitry 130 may output the control signal VC having a first logic value (e.g., a logic value of 0). In response to the control signal VC, the clock generator circuit 140 may switch a transiting edge (e.g., a rising edge RE) of the clock signal CLK2, such that the MDAC circuit 122 starts processing the corresponding digital code D1 and the signal S1.

Alternatively, if the detector circuitry 130 detects that the quantization of the signal S1 is not complete, the detector circuitry 130 may output the control signal VC having a second logic value (e.g., a logic value of 1). In response to the control signal VC, the clock generator circuit 140 may delay the transiting edge of the clock signal CLK2 (for example, the rising edge RE is delayed to be a rising edge RE'), such that a timing for the MDAC circuit 122 to process the corresponding digital code D1 and the signal S1 is delayed. In some embodiments, the clock generator circuit 140 may include an oscillator circuit having a delay control, which may adjust the clock signal CLK2 according to the control signal VC. Detailed operations regarding herein will be provided with reference to FIG. 2, FIG. 3A, and FIG. 3B.

The digital calibration circuit 150 is configured to combine the digital codes D1 to generate a digital code DOUT. In some embodiments, the digital calibration circuit 150 may be configured to calibrate an offset error in the sub-DAC circuit 122-1 and/or a gain error in the residue amplifier circuit 122-3. In some embodiments, the digital calibration circuit 150 may be implemented with digital logic circuit(s).

In some related approaches, the timing (e.g., transiting edge(s)) of the clock signal CLK2 are fixed. In these approaches, if the quantization is required to have a longer processing time due to practical process variation and/or a low voltage difference (e.g., a difference between the signal S1 and a reference voltage VREF1), the MDAC circuit may receive an inaccurate (e.g., unstable) digital code, and thus generates an inaccurate residue signal. Compared with the above approaches, in some embodiments of the present disclosure, with the detector circuitry 130, it is assured that the MDAC circuit 122 performs subsequent operations after the quantization is complete. As a result, the MDAC circuit 122 is able to receive a correct digital code, in order to generate the current stage residue signal S2[1] correctly. Moreover, by adjusting the amplification phase Tamplify, a current of the residue amplifier 122-3 can be lower, and thus the power consumption and the circuit area of the residue amplifier 122-3 can be reduced.

Figure 2:
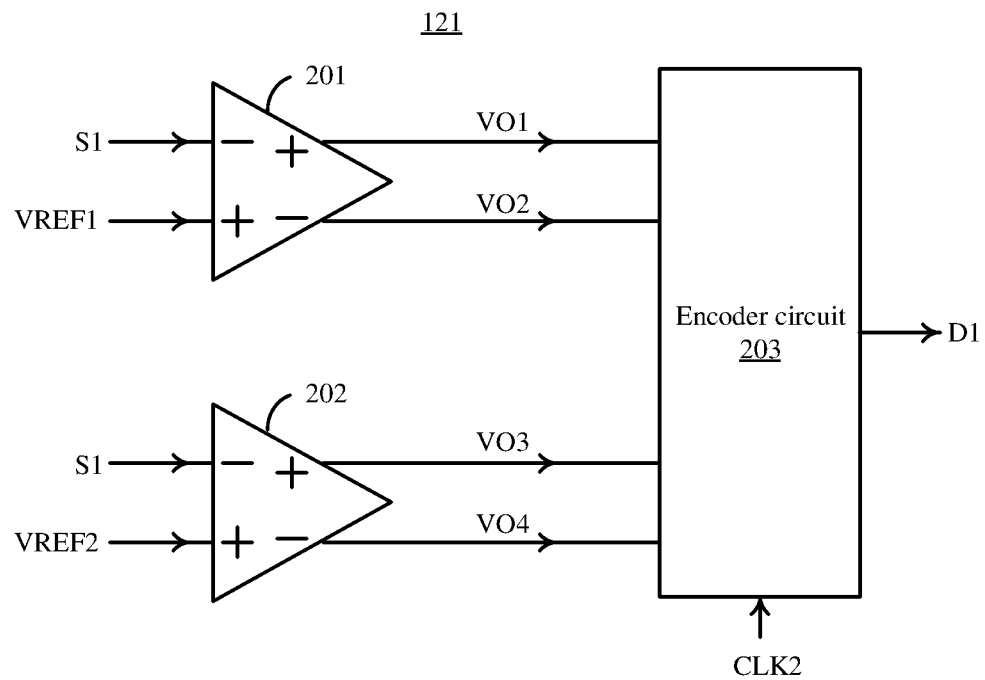
FIG. 2 is a schematic diagram of a sub-ADC circuit in FIG. 1A according to some embodiments of the present disclosure.

FIG. 2 is a schematic diagram of a sub-ADC circuit 121 in FIG. 1A according to some embodiments of the present disclosure. In some embodiments, the sub-ADC circuit 121 includes a comparator circuit 201, a comparator circuit 202, and an encoder circuit 203. The comparator circuit 201 and the comparator circuit 202 compares the signal S1 with the reference voltage VREF1 and the reference voltage VREF2, respectively (i.e., the aforementioned quantization), in order to generate output signals VO1-VO4.

In greater detail, the comparator circuit 201 compares the signal S1 with the reference voltage VREF1, in order to generate the output signal VO1 and the output signal VO2. In some embodiments, the comparator circuit 201 may be a differential comparator circuit. In an initial state, two output terminals of the differential comparator circuit are reset to have a predetermined level, such that the output signal VO1 and the output signal VO2 have the predetermined level. For example, the predetermined level is a high level, and the output signal VO1 and the output signal VO2 have logic values of 1 in the initial state. Alternatively, in some other embodiments, the predetermined level is a low level, and the output signal VO1 and the output signal VO2 have logic values of 0 in the initial state. After the comparison of the signal S1 and the reference voltage VREF1 is complete, one output terminal of the comparator circuit 201 has a high level, and another output terminal of the comparator circuit 201 has a low level. In other words, after the quantization is complete, one of the output signal VO1 and the output signal VO2 has the logic value of 1, and another one of the output signal VO1 and the output signal VO2 has the logic value of 0. Accordingly, the detector circuitry 130 may determine whether the quantization is complete according to logic values of the output signal VO1 and the output VO2.

Similarly, the comparator circuit 202 compares the signal S1 with the reference voltage VREF2, in order to generate the output signal VO3 and the output signal VO4. Operations of the comparator circuit 202 may be understood with reference to those of the comparator circuit 201, and thus a repetitious descriptions are not further given. In some embodiments, the reference voltage VREF1 may be (but not limited to) about 0.25 times a positive reference voltage, and the reference voltage VREF2 may be (but not limited to) about −0.25 times a negative reference voltage, in which the positive reference voltage and the negative reference voltage may be configured to define a maximum input signal range.

The encoder circuit 203 is configured to encode the output signals VO1-VO4 according to the clock signal CLK2, in order to output a corresponding one of the digital codes D1. In some embodiments, the encoder circuit 203 may include logic gate circuits, which output the corresponding digital code D1 when the clock signal CLK2 has a high level. For example, the encoder circuit 203 may include AND gate circuits (not shown). Certain AND gate circuits generate first signals respectively according to the output signal VO1 and the output signal VO3, the output signal VO2 and the output signal VO3, and the output signal VO2 and the output signal VO4. The remaining AND gate circuits are configured to output the first signals to be bits of the corresponding digital code D1 respectively when the clock signal CLK2 has the high level. The above implementations about the encoder circuit 203 are given for illustrative purposes, and the present disclosure is not limited thereto. Various types of the encoder circuit 203 are within the contemplated scope of the present disclosure.

Figure 3A:
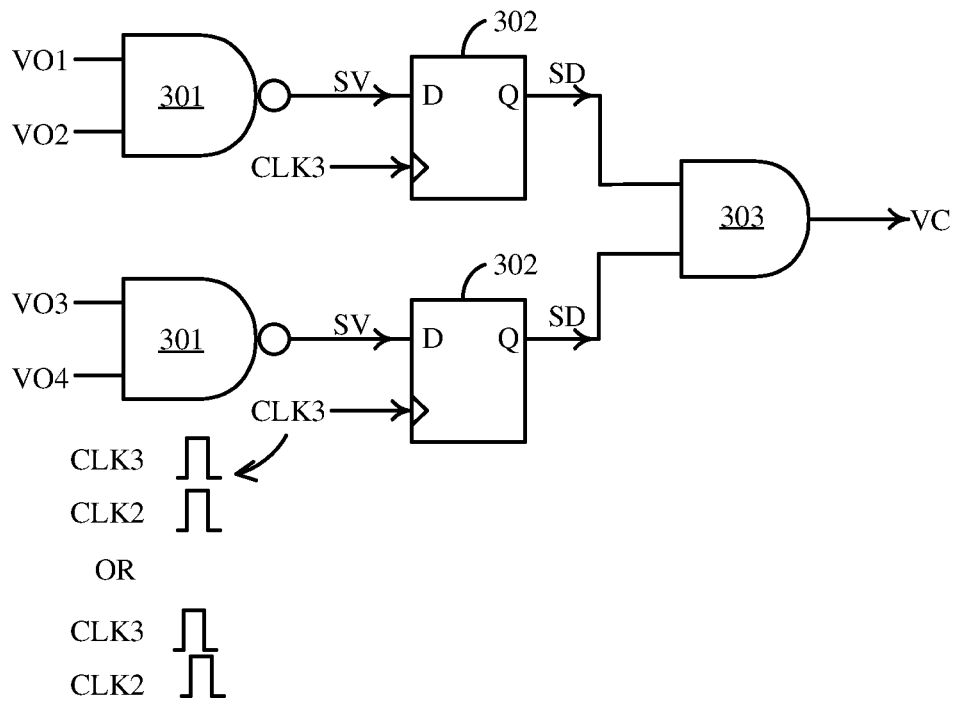
FIG. 3A is a schematic diagram of the detector circuitry in FIG. 1A according to some embodiments of the present disclosure.

FIG. 3A is a schematic diagram of the detector circuitry 130 in FIG. 1A according to some embodiments of the present disclosure. The detector circuitry 130 includes logic gate circuits 301, flip flop circuits 302, and the logic gate circuit 303. As mentioned above, in examples of FIG. 2, the output signal VO1 and the output signal VO2 have the logic values of 1 in the initial state. After the comparison is complete, one of the output signal VO1 and the output signal VO2 has the logic value of 1, and another one of the output signal VO1 and the output signal VO2 has the logic value of 0. Under this condition, each logic gate circuit 301 may be implemented with a NAND gate circuit. The logic gate circuits 301 generate valid signals SV according to the output signals VO1-VO4. For example, the first logic gate circuit 301 generates the valid signal SV according to the output signals VO1 and VO2. If the output signal VO1 the output signal VO2 all have the logic values of 1, the logic gate circuit 301 may outputs the valid signal SV having the logic value of 0, in order to indicate that the quantization is not complete. If one of the output signal VO1 and the output signal VO2 has the logic value of 1, and another one of the output signal VO1 and the output signal VO2 has the logic value of 0, the first logic gate circuit 301 may output the valid signal SV having the logic value of 1, in order to indicate that the quantization is complete. Similarly, the second logic gate circuit 301 may generate the valid signal SV according to the output signal VO3 and VO4.

The flip flop circuits 302 respectively receive the valid signals SV according to a clock signal CLK3, in order to generate the detection signals SD. In some embodiments, each flip flop circuits 302 may be a D-type flip flop circuit. In some embodiments, the clock signal CLK3 may be the same as the clock signal CLK2. In some embodiments, the clock signal CLK3 and the clock signal CLK2 may be configured to have the same initial timing, or a phase of the clock signal CLK3 leads a phase of the clock signal CLK2. In response to a rising edge of the clock signal CLK3, the flip flop circuits 302 may output the valid signals SV to be the detection signals SD. If each detection signals SD has a predetermined logic value (which is logic value of 1 in this example), it indicates that the quantization of the signal S1 is complete. If at least two signals in the detection signals SD have different logic values (for example, one detection signal has the logic value of 0, and another one detection signal SD has the logic value of 1), or if each of the detection signals SD does not have the predetermined logic value, it indicates that the quantization of the signal S1 is not complete.

The logic gate circuit 303 is configured to determine whether the quantization of the signal S1 is complete according to the detection signals SD, in order to generate the control signal VC. In this example, the logic gate circuit 303 may be an AND gate circuit, which generates the control signal VC according to the detection signals SD. When each detection signal SD has the logic value of 1, the logic gate circuit 303 determines that the quantization is complete, and outputs the control signal VC having the logic value of 1. When at least two of the detection signals SD have different logic values, or when each detection signal SD does not have the logic value of 1, the logic gate circuit 303 determines that the quantization is incomplete, and outputs the control signal VC having the logic value of 0.

Figure 3B:
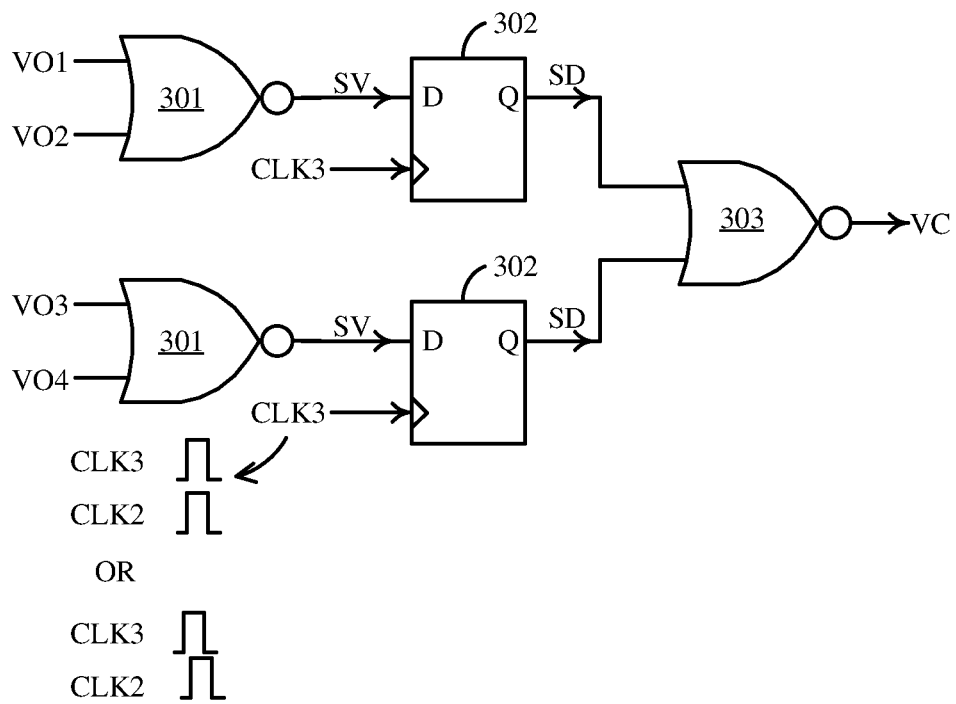
FIG. 3B is a schematic diagram of the detector circuitry in FIG. 1A according to some embodiments of the present disclosure.

FIG. 3B is a schematic diagram of the detector circuitry 130 in FIG. 1A according to some embodiments of the present disclosure. As mentioned above, in some other embodiments of FIG. 2, the output signal VO1 and the output signal VO2 have the logic values of 0 in the initial state. After the comparison is complete, one of the output signal VO1 and the output signal VO2 has the logic value of 1, and another one of the output signal VO1 and the output signal VO2 has the logic value of 0. Under this condition, each logic gate circuit 301 may be implemented with an NOR gate circuit. If each of the output signal VO1 and the output signal VO2 has the logic value of 0, the logic gate circuit 301 may output the valid signal SV having the logic value of 1, in order to indicate that the quantization is not complete. If one of the output signal VO1 and the output signal VO2 has the logic value of 1, and another one of the output signal VO1 and the output signal VO2 has the logic value of 0, the logic gate circuit 301 may output the valid signal SV having the logic value of 0, in order to indicate that the quantization is complete. Similarly, the second logic gate circuit 301 may generate the valid signal SV according to the output signal VO3 and the output signal VO4.

In this example, the logic gate circuit 303 may be an NOR gate circuit, which generates the control signal VC according to the detection signals SD. If each detection signal SD has a predetermined logic value (which is the logic value of 0 in this example), the logic gate circuit 303 determines that the quantization is complete, and outputs the control signal VC having the logic value of 1. If at least two of the detection signals SD have different logic values, or if each detection signal SD does not have the predetermined logic value, the logic gate circuit 303 determines that the quantization is not complete, and outputs the control signal VC having the logic value of 0.

Figure 4:
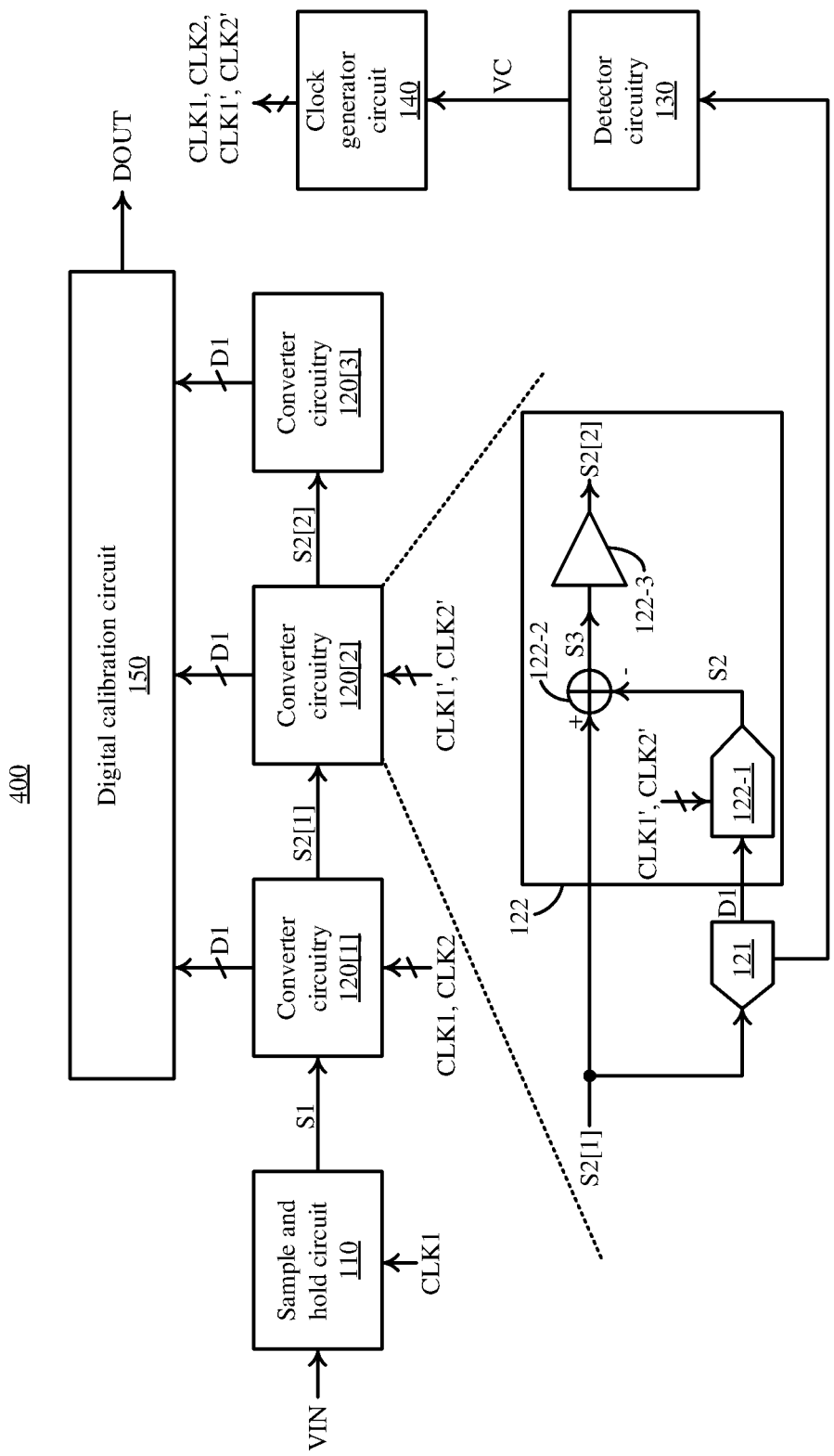
FIG. 4 is a schematic diagram of a pipeline ADC according to some embodiments of the present disclosure.

FIG. 4 is a schematic diagram of a pipeline ADC 400 according to some embodiments of the present disclosure. For illustrative purposes, the above embodiments are given with reference to examples where the amplification phase Tamplify of the converter circuitry 120[1] is adjusted, but the present disclosure is not limited thereto. For example, as shown in FIG. 4, the amplification phase of the converter circuitry 120[2] may be adjusted as well (i.e., the clock signal CLK2' is adjusted). In this example, the sub-ADC circuit 121 is configured to perform the quantization according to a previous stage residue signal S2[1], in order to generate a corresponding one of the digital codes D1. Rest operations are similar to those in the previous embodiments, and the repetitious descriptions are not further given.

Figure 5:
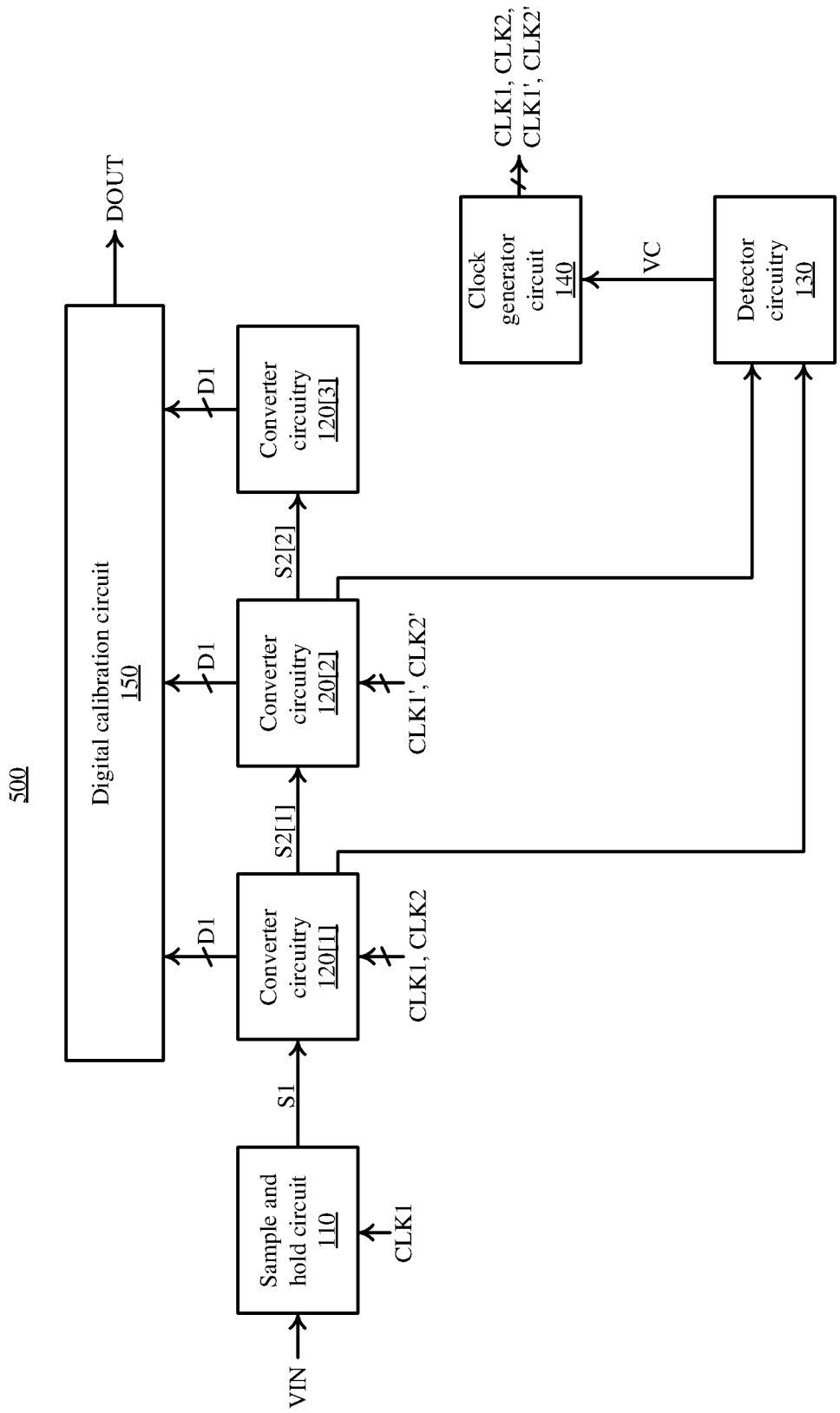
FIG. 5 is a schematic diagram of a pipeline ADC according to some embodiments of the present disclosure.

FIG. 5 is a schematic diagram of a pipeline ADC 500 according to some embodiments of the present disclosure. In this example, both of the amplification phases of the converter circuitry 120[1] and the converter circuitry 120[2] are adjusted. For example, the detector circuitry 130 includes two sets of circuits shown in FIG. 3A or FIG. 3B, one set of circuits detects whether the quantization of the converter circuitry 120[1] is complete to adjust the clock signal CLK2, and another set of circuits detects whether the quantization of the converter circuitry 120[2] is complete to adjust the clock signal CLK2'.

Figure 6:
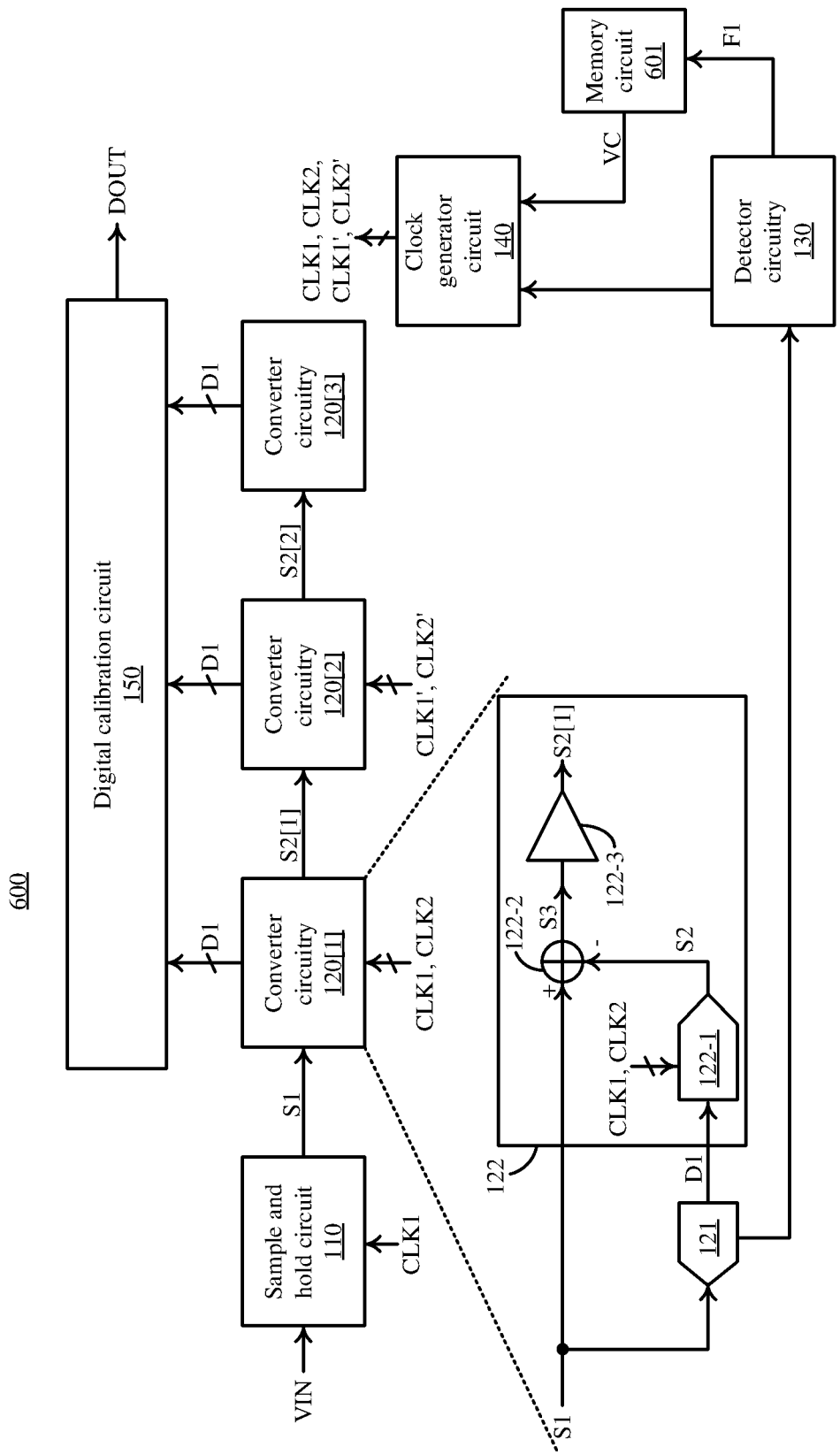
FIG. 6 is a schematic diagram of a pipeline ADC according to some embodiments of the present disclosure.

FIG. 6 is a schematic diagram of a pipeline ADC 600 according to some embodiments of the present disclosure. Compared with the previous embodiments, in this example, the pipeline ADC 600 further includes a memory circuit 601. In some embodiments, in a test before being dispatched from the factory, the detector circuitry 130 may detect a maximum delay time required by at least one of the clock signal CLK2 and the clock signal CLK2', and record the maximum delay time to the memory circuit 601 as information F1. The clock generator circuit 140 may read the memory circuit 601 to obtain the control signal VC according to the information F1. In some embodiments, the memory circuit 601 may be a register circuit. In some embodiments, the memory circuit 601 may be integrated into the clock generator circuit 140. In some embodiments, the detection result(s) of the detector circuitry 130 and the clock signal(s) generated from the clock generator circuit 140 may be transmitted back to an external measurement tool, in order to analyze the maximum delay time to generate the information F1.

In some embodiments, operations of the detector circuitry 130 and the memory circuit 601 are similar to a foreground calibration mechanism, in which the detector circuitry 130 and the memory circuit 601 may adjust at least one of the clock signal CLK2 and the clock signal CLK2' before the pipeline ADC 600 converts practical data. Correspondingly, in some embodiments shown in FIG. 1, FIG. 4, or FIG. 5, operations of the detector circuitry 130 are similar to a background calibration mechanism, which may dynamically adjust the clock signal CLK2 and the clock signal CLK2' in the course of the pipeline ADC 100, 400, or 500 converting the practical data.

A number of circuits and related arrangements in the above embodiments are given for illustrative purposes, and the present disclosure is not limited thereto. It is understood that, according to practical requirements (e.g., resolution, power consumption, etc.), the number of circuits and the related arrangements may be adjusted correspondingly.

Figure 7:
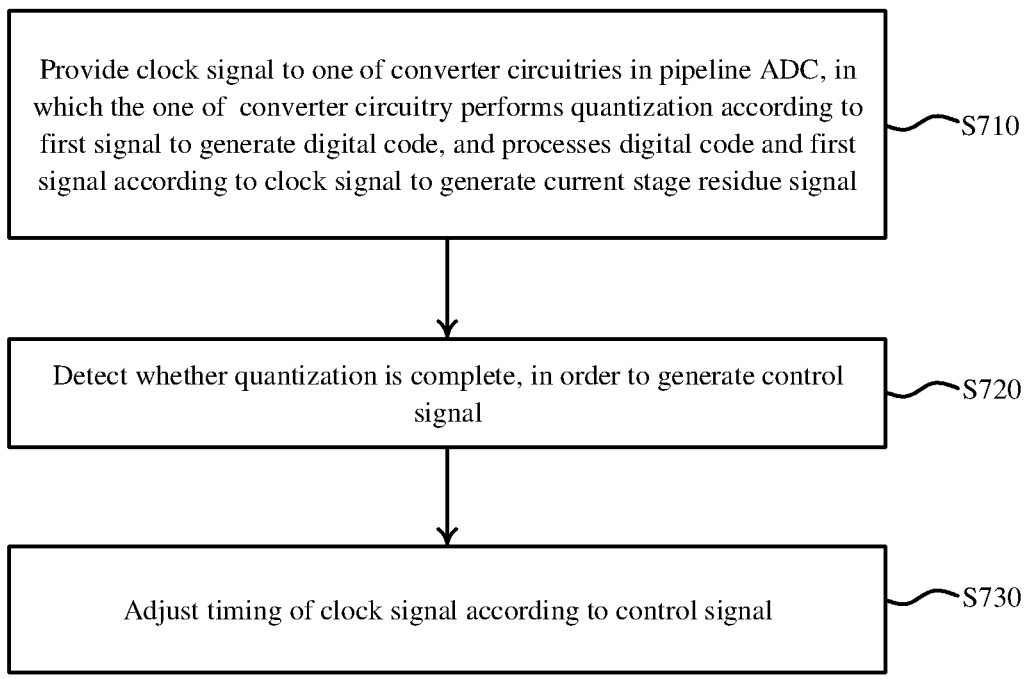
FIG. 7 is a flow chart of a timing adjustment method according to some embodiments of the present disclosure.

FIG. 7 is a flow chart of a timing adjustment method 700 according to some embodiments of the present disclosure. In operation S710, a clock signal is provided to one of converter circuitries in a pipeline ADC, in which the one of the converter circuitries performs a quantization according to a first signal to generate a digital code, and processes the digital code and the first signal according to the clock signal, in order to generate a current stage residue signal. In some embodiments, the signal is the input signal VIN or the previous stage residue signal (e.g., the residue signal S2[1]). In operation S720, whether the quantization is complete is detected, in order to generate the control signal. In operation S730, the timing of the clock signal is adjusted according to the control signal.

Operations S710, S720, and S730 can be understood with reference to the above embodiments, and thus the repetitious descriptions are not further given. The above description of the timing adjustment method 700 includes exemplary operations, but the operations are not necessarily performed in the order described above. Operations of the timing adjustment method 700 may be added, replaced, changed order, and/or eliminated as appropriate, or the operations are able to be executed simultaneously or partially simultaneously as appropriate, in accordance with the spirit and scope of various embodiments of the present disclosure.

As described above, the pipeline ADC and the timing adjustment method in some embodiments of the present disclosure may detect whether quantization of each converter circuitry is complete and adjust the amplification phase accordingly. As a result, each converter circuitry can be prevented from generating inaccurate digital codes, in order to save certain power and circuit area.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A pipeline analog to digital converter, comprising:
   a plurality of converter circuitries, configured to sequentially convert an input signal to be a plurality of digital codes, wherein one of the plurality of converter circuitries comprises:
   a sub-analog to digital converter circuit configured to perform a quantization according to a first signal to generate a corresponding one of the plurality of digital codes, wherein the first signal is the input signal or a previous stage residue signal; and
   a multiplying digital to analog converter circuit configured to process the corresponding one of the plurality of digital codes in response to a first clock signal, in order to generate a current stage residue signal;

a detector circuitry configured to detect whether the quantization is complete, in order to generate a control signal; and a clock generator circuit configured to adjust a timing of the first clock signal according to the control signal, wherein when the detector circuitry detects that the quantization is complete, the clock generator circuit is configured to switch a transiting edge of the first clock signal according to the control signal, such that the multiplying digital to analog converter circuit starts processing the corresponding one of the plurality of digital codes and the first signal.

2. The pipeline analog to digital converter of claim 1, wherein the detector circuitry comprises:

a plurality of first logic gate circuits configured to generate a plurality of valid signals according to a plurality of output signals from the sub-analog to digital converter circuit;

a plurality of flip flop circuits configured to respectively receive the plurality of valid signals according to a second clock signal, in order to generate a plurality of detection signals; and a second logic gate circuit configured to determine whether the quantization is complete according to the plurality of detection signals, in order to generate the control signal.

3. The pipeline analog to digital converter of claim 2, wherein when each of the plurality of detection signals has a predetermined logic value, the second logic gate circuit determines that the quantization is complete.

4. The pipeline analog to digital converter of claim 2, wherein when at least two of the plurality of detection signals have different logic values, or when each of the plurality of detection signals does not have a predetermined logic value, the second logic gate determines that the quantization is not complete.

5. The pipeline analog to digital converter of claim 2, wherein the sub-analog to digital converter circuit comprises:

a plurality of comparator circuits configured to compare the first signal with a plurality of reference voltages, respectively, in order to generate the plurality of output signals; and an encoder circuit configured encode the plurality of output signals, in order to output the corresponding one of the plurality of digital codes.

6. The pipeline analog to digital converter of claim 2, wherein the second clock signal is the same as the first clock signal, or a phase of the second clock signal leads a phase of the first clock signal.

7. The pipeline analog to digital converter of claim 2, wherein each of the plurality of first logic gate circuits is a NAND gate circuit or a NOR gate circuit.

8. The pipeline analog to digital converter of claim 2, wherein the second logic gate circuit is an AND gate circuit or a NOR gate circuit.

9. The pipeline analog to digital converter of claim 1, further comprising:

a memory circuit configured to store information that indicates a maximum delay time of the first clock signal, wherein the detector circuitry is further configured to generate the information, and the clock generator circuit is further configured to obtain the control signal according to the information.

10. A timing adjustment method, comprising:

providing a first clock signal to one of a plurality of converter circuitries in a pipeline analog to digital converter, wherein the one of the plurality of converter circuitries is configured to perform a quantization according to a first signal to generate a digital code, and process the digital code and the first signal to generate a current stage residue signal;

detecting whether the quantization is complete, in order to generate a control signal;

storing information that indicates a maximum delay time of the first clock signal to a memory circuit;

obtaining the control signal from the memory circuit according to the information; and adjusting a timing of the first clock signal according to the control signal.

11. The timing adjustment method of claim 10, wherein adjusting the timing of the first clock signal according to the control signal comprises:

when the quantization is detected to be complete, switching a transiting edge of the first clock signal according to the control signal, such that the one of the plurality of converter circuitries starts processing the digital code and the first signal.

12. The timing adjustment method of claim 10, wherein adjusting the timing of the first clock signal according to the control signal comprises:

when the quantization is detected to be not complete, delaying a transiting edge of the first clock signal according to the control signal, such that a timing for the one of the plurality of converter circuitries to process the digital code and the first signal is delayed.

13. The timing adjustment method of claim 10, wherein detecting whether the quantization is complete, in order to generate the control signal comprises:

generating a plurality of valid signals according to a plurality of output signals from a sub-analog to digital converter circuit in the one of the plurality of converter circuitries;

respectively receiving the plurality of valid signals according to a second clock signal, in order to generate a plurality of detection signals; and determining whether the quantization is complete according to the plurality of detection signals, in order to generate the control signal.

14. The timing adjustment method of claim 13, wherein determining whether the quantization is complete according to the plurality of detection signals, in order to generate the control signal comprises:

when each of the plurality of detection signals has a predetermined logic value, determining that the quantization is complete.

15. The timing adjustment method of claim 13, wherein determining whether the quantization is complete according to the plurality of detection signals, in order to generate the control signal comprises:

when at least two of the plurality of detection signals have different logic values, or when each of the plurality of detection signals does not have a predetermined logic value, determining that the quantization is not complete.

16. The timing adjustment method of claim 13, wherein the second clock signal is the same as the first clock signal.

17. The timing adjustment method of claim 13, wherein a phase of the second clock signal leads a phase of the first clock signal.

18. A pipeline analog to digital converter, comprising:
a plurality of converter circuitries, configured to sequentially convert an input signal to be a plurality of digital codes, wherein one of the plurality of converter circuitries comprises:
a sub-analog to digital converter circuit configured to perform a quantization according to a first signal to generate a corresponding one of the plurality of digital codes, wherein the first signal is the input signal or a previous stage residue signal; and
a multiplying digital to analog converter circuit configured to process the corresponding one of the plurality of digital codes in response to a first clock signal, in order to generate a current stage residue signal;
a detector circuitry configured to detect whether the quantization is complete, in order to generate a control signal; and
a clock generator circuit configured to adjust a timing of the first clock signal according to the control signal,
wherein when the detector circuitry detects that the quantization is not complete, the clock generator circuit is configured to delay a transiting edge of the first clock signal according to the control signal, such that a timing for the multiplying digital to analog converter circuit to process the corresponding one of the plurality of digital codes and the first signal is delayed.

* * * * *